United States Patent [19]

Hashimoto et al.

[11] Patent Number: 4,787,087

[45] Date of Patent: Nov. 22, 1988

[54] CIRCUIT FOR DRIVING A LASER DIODE

[75] Inventors: Nobuyuki Hashimoto; Kazuya Ohike, both of Tokorozawa, Japan

[73] Assignee: Citizen Watch Co., Ltd., Tokyo, Japan

[21] Appl. No.: 21,333

[22] Filed: Mar. 3, 1987

[30] Foreign Application Priority Data

Mar. 4, 1986 [JP] Japan .................................. 61-45199
Mar. 7, 1986 [JP] Japan .................................. 61-50022

[51] Int. Cl.$^4$ .............................................. H01S 3/13
[52] U.S. Cl. ........................................ 372/29; 372/38
[58] Field of Search ............... 307/268, 285, 311, 362; 372/25, 26, 29, 30, 31, 33, 34, 38, 43

[56] References Cited

U.S. PATENT DOCUMENTS 4,009,385 2/1977 Sell ........................................ 372/38
4,348,648 9/1982 Childs ................................... 372/29
4,484,331 11/1984 Miller ................................... 372/38

Primary Examiner—William L. Sikes
Assistant Examiner—B. Randolph
Attorney, Agent, or Firm—Birch, Stewart, Kolasch & Birch

[57] ABSTRACT

A driving circuit for a laser diode has an exciting circuit for intermittently exciting the laser diode. A photodiode is provided for detecting the beam power emitted from the laser diode, and a resistor is connected to the photodiode in series. Voltage across the resistor is stored in a capacitor of a charging circuit. The stored voltage is applied to a constant current circuit to control a current supplied to the laser diode to stabilize beam power of the laser diode.

4 Claims, 2 Drawing Sheets

CIRCUIT FOR DRIVING A LASER DIODE

BACKGROUND OF THE INVENTION

The present invention relates to a circuit for driving a laser diode, and more particularly to a circuit which may stabilize the power of the laser diode beam.

The power of the laser diode beam has a temperature-dependent characteristic. In order to prevent the variation of power characteristic and to stabilize the power of beam, the beam power is detected and fed back to control the current flowing in the laser diode.

Meanwhile, recently, a laser-beam printer employing a laser diode has attracted considerable attention. In a laser-beam printer, an optical device is positioned to cause the laser-beam to scan each dot line on a light-sensitive drum. At a start point of the scanning which is located outside the drum, the laser diode is excited to provide a timing signal. When the laser-beam reaches an initiation point, a sensor detects the laser-beam to produce a signal. By the signal, the laser diode is turned off. When the laser-beam reaches a predetermined starting point on the drum and there is at least one dot to be printed on the dot line, the laser diode is intermittently excited in accordance with a command signal to start to scan the dot line from the starting point. However, if there is no dot to be printed on the dot line, that is the dot line is blank, the command signal is not produced, and hence the laser diode is not excited after the starting point. In such a case, although the laser diode remains off, the optical device has operated through one cycle.

However, in order to stabilize the power of the laser diode beam, it is necessary to store a value of the beam power at the instant cycle so as to produce the same beam power in the next cycle.

Thus, when a dot line is blank, the power of the beam at the beginning operation of the scanning must be stored until the beginning of the next cycle, since the laser diode is not excited after the initiation point. For this purpose, a sample-and-hold circuit is usually employed.

However, the sample-and-hold circuit has a complicated structure. Further, if the timing for producing sampling pulses does not synchronize with switching pulses for the laser diode, the laser diode malfunctions.

SUMMARY OF THE INVENTION

The object of the present invention is to provide a circuit which is simple in structure and ensures stable laser beam power.

According to the present invention, there is provided a circuit for driving a laser diode comprising an exciting circuit for intermittently exciting the laser diode, a photodiode for detecting the beam power emitted from the laser diode, a resistor serially connected to the photodiode, a charging circuit having a capacitor for applying a voltage across the resistor, and a constant current circuit responsive to the voltage in the capacitor for supplying constant current to the laser diode.

In one aspect of the invention, the exciting circuit comprises a transistor connected to the laser diode in parallel and arranged to be intermittently turned on by clock pulses, and the constant current circuit includes an operational amplifier applied with the voltage produced in the charging circuit and a transistor connected to the laser diode in series and operative from an output voltage of the operational amplifier to control the current flowing in the laser diode to stabilize the beam power of the laser diode.

These and other objects and features of the present invention will become more apparent from the following description with reference to the accompanying drawings.

DESCRIPTION OF THE PREFERRED EMBODIMENTS

Figure 1:
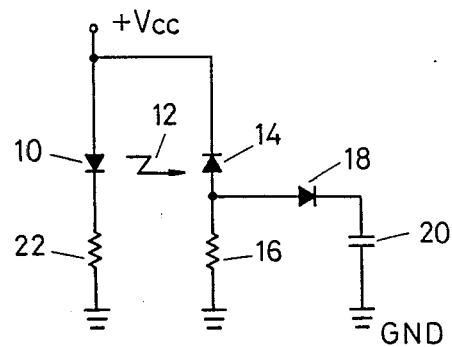
FIG. 1 is a circuit showing the principle of the present invention.

Referring to FIG. 1 showing the principle of the present invention, a laser diode 10 emits the laser beam 12, a value of a power of which is detected by a photodiode 14 to produce a voltage proportional to the power of the laser beam 12 across a resistor 16. Then, the voltage is stored in a one-way charging circuit comprising a diode 18 and a capacitor 20. Thus, if the power of the laser diode beam 12 goes to zero, the value of the beam power at the last excitation of the laser diode is stored in the capacitor 20 as a voltage.

Figure 2:
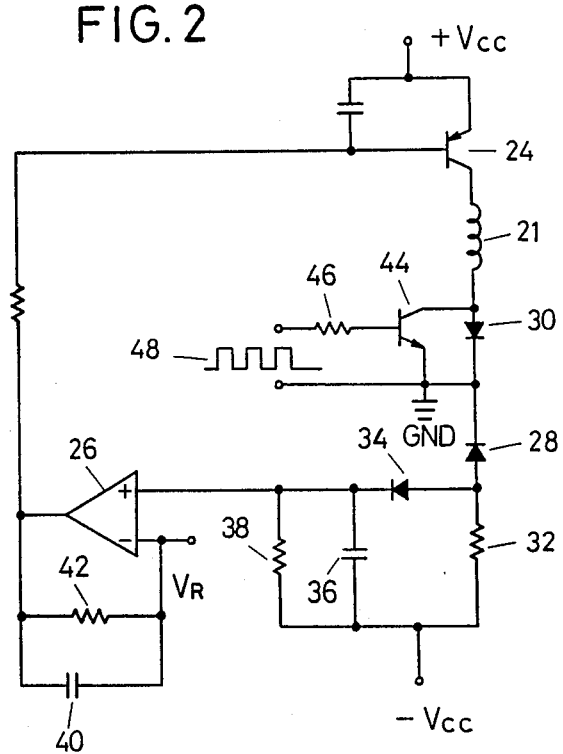
FIG. 2 is a circuit for driving a laser diode according to the present invention.

Referring to FIG. 2 showing an embodiment of the present invention, a PNP transistor 24, an inductor 21, and a laser diode 30 are connected in series between a positive source +Vcc and a ground GND. The transistor 24 is applied with a bias voltage from an output of an operational amplifier 26 at a base thereof. The transistor 24 constitutes a constant current supply when the bias voltage is constant as described hereinafter. Further, a photodiode 28 and a resistor 32 are connected in series between the ground and a negative sorce −Vcc. The photodiode 28 detects the power of a laser beam from the laser diode 30 to produce a voltage proportional to the power of the laser beam across the resistor 32. The voltage is applied to a non-inverting input terminal of operational amplifier 26 through a diode 34 and a reference voltage VR is applied to an inverting input terminal of the operational amplifier.

When beam power emitted from the laser diode 30 exceees a predetermined value, the light detecting current of the photodiode 28 increases, whereby the voltage across the resistor 32 becomes high. Thus, the voltage applied to the non-inverting input terminal of the operational amplifier 26 rises to elevate the output voltage of the amplifier 26. As a result, the base voltage of PNP transistor 24 increases to reduce the collector current. Accordingly, beam power of the laser diode 30 decreases.

When beam power of the laser diode 30 becomes smaller than a predetermined value, reversed phenomena occur in the circuit so that the beam power increases. Thus, power of the laser diode 30 is automatically stabilized. The beam power of the laser diode 30 can be changed by changing the impedance of the resistor 32 or by changing the value of the reference voltage VR.

An NPN transistor 44 is connected in parallel to the laser diode 30 between a collector and an emitter thereof. The base of the transistor 44 is applied with TTL clock pulses 48 through a resistor 46. When the transistor 44 is aplied with a high clock pulse, the transistor 44 is turned on. A current flows from the collector to emitter so that the laser diode 30 is turned off. Thus, the laser diode 30 is intermittently turned on and off.

The diode 34 and capacitor 36 constitute a one-way charging circuit. The circuit is provided for storing the value of beam power of the laser diode 30 at the last excitation as a voltage when the laser diode is turned off.

A resistor 38 is provided for determining the time constant after which the voltage charged in the capacitor 36 is discharged. If the resistor 38 has a large resistance, the discharge time is long to extend the period for storing the voltage in the capacitor 36. Thus, even if the laser diode 30 is turned off for a long period, the previous value of beam power of the laser diode can be held as a stored voltage until the next cycle.

In the case of a laser-beam printer, the laser diode is turned off during a large part of one cycle of a laser-beam scanning operation, when the dot line is blank, as mentioned above. Accordingly, it is necessary to store the voltage at least for one cycle of a laser-beam scanning operation so as to excite the laser diode at the beginning of the next scanning cycle.

The impedance of the non-inverting input terminal of the operational amplifier 26 is normally about 100 MΩ. Therefore, it is possible to obtain the time constant for discharging the voltage by using the impedance, thereby omitting the resistor 38.

A capacitor 40 and a resistor 42 constitute a negative feedback circuit. During the turning off of the laser diode 30, the voltage stored in the capacitor 36 gradually reduces. The negative feedback circuit is provided for preventing the variation of the output of operational amplifier 26, as a result of the reduction of the voltage stored in the capacitor 36.

In an embodiment of the invention, the capacitor 36 of 0.033 μF and the capacitor 40 of 0.033 μF are employed and the beam power of the laser diode 30 is set to about 3.5 mW, omitting the resistor 38. In such a system, it has been confirmed that if laser diode 30 is excited for about 100 μs, the laser diode 30 stably produces a power of 3.5 mW after the laser diode has been turned off for about 2000 μs.

At temperatures between −20° C. and +80° C., the variation of beam power of the laser diode was not over ±2%. In spite of ambient temperature variations of about 1° C./sec, beam power of the laser diode was stabilized. Even if the laser diode 30 was turned on at a high frequency such as 20 MHz and at a duty ratio of 50%, the power of beam was stably held.

Figure 3:
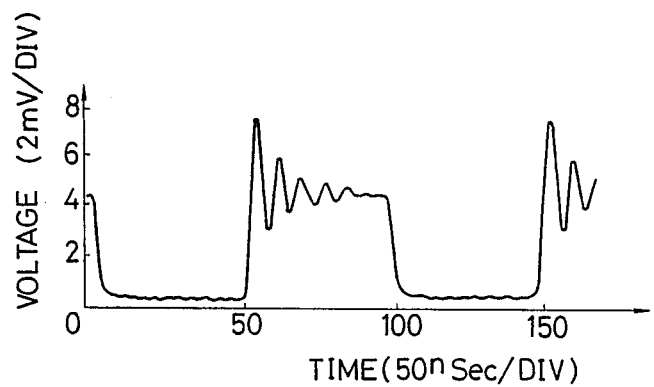
FIG. 3 is a graph of waveforms showing the power of the laser diode beam provided in a conventional circuit.

On the other hand, if the laser diode is driven at a high frequency such as 10 MHz to 20 MHz, ringing of the beam power occurs, as shown in FIG. 3. In order to prevent the beam power from ringing, an inductance element is provided in the circuit. Namely, the inductor 21 of 10 μH is provided between the collector of the transistor 24 and the anode of laser diode 30. If the forward current applied to the laser diode 30 increases rapidly, the inductor 21 produces a reverse induced electromotive force corresponding to the variation of the current so as to cancel the excessive current flowing in the laser diode 30 in a brief moment. As the forward current approaches a predetermined value, the variation rate of the forward current reduces. As a result, the induced electromotive current reduces so that a constant current flows in the laser diode 30.

When transistor 44 becomes conductive rapidly, the current to the transistor 44 is rapidly increased. The same effect as hereinbefore described is achieved to keep the collector current of the transistor 24 constant.

Figure 4:
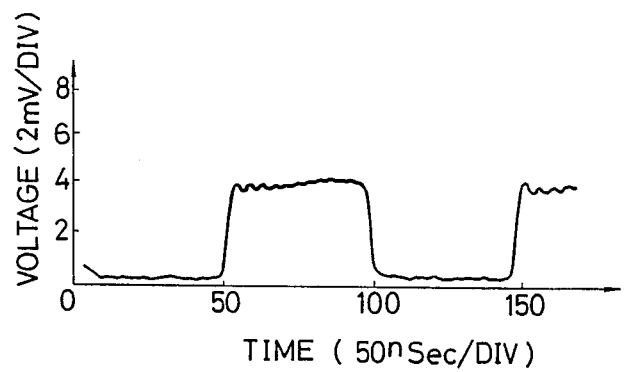
FIG. 4 is a graph of waveforms showing the power of the laser diode beam provided in a circuit of the present invention.

Accordingly, as shown in FIG. 4, the beam power of the laser diode 30 has a waveform in which the ringing is remarkably reduced compared with the waveform shown in FIG. 3. In each of FIG. 3 and FIG. 4, the value of the graphs of the voltage on the vertical axis is proportional to the beam power of the laser diode.

From the foregoing, it will be understood that the present invention provides a circuit for driving a laser diode having a simple structure and stably producing a constant laser diode beam power.

While the invention has been described in conjuction with preferred specific embodiments thereof, it will be understood that this description is intended to illustrate and not limit the scope of the invention, which is defined by the following claims.

What is claimed is:

1. A circuit for driving a laser diode comprising:
    an exciting circuit for energizing said laser diode, including a first transistor connected to said laser diode in parallel and supplied with clock pulses so as to be intermittently turned on and off;
    a photodiode for detecting the power of a beam emitted from said laser diode upon energization;
    a first resistor serially connected to said photodiode;
    a charging circuit for storing a voltage appearing across said first resistor that is representative of the power detected by said photodiode, said charging circuit being a one-way charging circuit including a diode and a capacitor connected in parallel to said first resistor; and
    a constant current circuit, responsive to the voltage stored in said capacitor, for supplying a constant energization current to said laser diode, said constant current circuit including
        an operational amplifier having a non-inverting terminal coupled to the voltage stored in said capacitor, and
        a second transistor serially connected to said laser diode, a base terminal of which is connected to an output terminal of said operational amplifier so as to control the amount of energization current flowing in said laser diode.

2. The circuit according to claim 1, further comprising an inductor connected between said second transistor and said laser diode.

3. The circuit according to claim 1, further comprising a second resistor connected in parallel with said capacitor, said second resistor forming part of an RC time constant for the discharge of the voltage stored in said charging circuit.

4. The circuit according to claim 1, further comprising a negative feedback circuit including a second capacitor and a second resistor connected between an inverting input terminal and said output terminal of said operational amplifier.

* * * * *